(12) United States Patent
Zhao et al.

(10) Patent No.: US 10,208,375 B2
(45) Date of Patent: Feb. 19, 2019

(54) EVAPORATION SOURCE AND EVAPORATION DEVICE

(71) Applicant: BOE TECHNOLOGY GROUP CO., LTD., Beijing (CN)

(72) Inventors: Dejiang Zhao, Beijing (CN); Seiji Fujino, Beijing (CN); Changhai Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 218 days.

(21) Appl. No.: 15/151,292

(22) Filed: May 10, 2016

(65) Prior Publication Data

US 2017/0051395 A1 Feb. 23, 2017

(30) Foreign Application Priority Data

Aug. 20, 2015 (CN) .......................... 2015 1 0514260

(51) Int. Cl.
| H05B 3/48 | (2006.01) |
| H05B 3/46 | (2006.01) |
| H05B 3/56 | (2006.01) |
| H05B 3/58 | (2006.01) |
| C23C 14/24 | (2006.01) |
| H01L 51/56 | (2006.01) |
| H01L 51/00 | (2006.01) |
| H01L 51/05 | (2006.01) |

(52) U.S. Cl.
CPC .............. *C23C 14/243* (2013.01); *H05B 3/48* (2013.01); *H01L 51/001* (2013.01); *H01L 51/0595* (2013.01); *H01L 51/56* (2013.01)

(58) Field of Classification Search
CPC ............... H05B 3/40–3/58; F16L 53/00–53/38
USPC .................. 392/386–406, 478–494; 219/535
See application file for complete search history.

(56) References Cited

U.S. PATENT DOCUMENTS

| 2,767,300 A * | 10/1956 | De Verter ............ B23K 3/0646 219/421 |
| 3,155,759 A * | 11/1964 | Marshall ................. F27D 11/02 219/426 |
| 3,694,165 A * | 9/1972 | Kramer ................... C30B 15/14 117/217 |

(Continued)

FOREIGN PATENT DOCUMENTS

| CN | 102828236 A | 12/2012 |
| CN | 103673596 A | 3/2014 |
| CN | 104078626 A | 10/2014 |

OTHER PUBLICATIONS

Second Office Action regarding Chinese Application No. 201510514260.5, dated Aug. 17, 2017. Translation provided by Dragon Intellectual Property Law Firm.

(Continued)

*Primary Examiner* — Michael LaFlame, Jr.
(74) *Attorney, Agent, or Firm* — Harness, Dickey & Pierce, P.L.C.

(57) ABSTRACT

An evaporation source includes a heat source structure and an evaporation container for accommodating a to-be-evaporated material. The heat source structure includes a heat source and a thermal conductor. The thermal conductor is in contact with the evaporation container, and the heat source is at the thermal conductor and around the evaporation container.

20 Claims, 4 Drawing Sheets

(56) References Cited

U.S. PATENT DOCUMENTS

| | | | | |
|---|---|---|---|---|
| 3,940,589 | A | * | 2/1976 | Tupper ................... A47J 27/004 219/417 |
| 4,581,521 | A | * | 4/1986 | Grise ....................... F16L 53/38 219/535 |
| 4,748,315 | A | * | 5/1988 | Takahashi ............. C23C 14/243 118/726 |
| 5,031,229 | A | * | 7/1991 | Chow ................... C23C 14/243 392/389 |
| 5,883,349 | A | * | 3/1999 | Kingston ............. B01J 19/0073 204/157.15 |
| 6,011,904 | A | * | 1/2000 | Mattord ................ C30B 23/066 118/726 |
| 6,871,507 | B1 | | 3/2005 | Goldsmith |
| 9,410,652 | B2 | * | 8/2016 | Ellis ...................... F16L 53/007 |
| 2004/0200416 | A1 | * | 10/2004 | Schuler ................. C23C 14/243 118/723 E |
| 2005/0145616 | A1 | * | 7/2005 | Ptasienski ........... B29C 45/1782 219/535 |
| 2009/0250453 | A1 | * | 10/2009 | Okada ..................... F27B 14/06 219/438 |
| 2010/0189897 | A1 | * | 7/2010 | Braun ................... C23C 14/243 427/248.1 |
| 2010/0206863 | A1 | * | 8/2010 | Ritter ................... B60N 2/5685 219/202 |
| 2012/0103251 | A1 | * | 5/2012 | Sakamoto ................. C30B 9/00 117/208 |
| 2012/0275984 | A1 | * | 11/2012 | Nishiguchi ........... C30B 23/025 423/345 |
| 2014/0076888 | A1 | * | 3/2014 | Kong .................... G02F 1/1303 219/719 |
| 2015/0152569 | A1 | * | 6/2015 | Okada ..................... C30B 29/36 117/28 |
| 2015/0332942 | A1 | * | 11/2015 | Peh ................... H01L 21/67109 165/253 |
| 2016/0258051 | A1 | * | 9/2016 | Liu ......................... C23C 14/26 |

OTHER PUBLICATIONS

First Office Action regarding Chinese Application No. 201510514260.5, dated Mar. 29, 2017. Translation provided by Dragon Intellectual Property Law Firm.

Sun, Chengsong, *Structure of the Electron Beam Evaporation Source*, Publishing House of Northeastern University, pp. 46 and 48, 1st edition (1998).

* cited by examiner

EVAPORATION SOURCE AND EVAPORATION DEVICE

CROSS-REFERENCE TO RELATED APPLICATION

The present application claims a priority of the Chinese patent application No. 201510514260.5 filed on Aug. 20, 2015, which is incorporated herein by reference in its entirety.

TECHNICAL FIELD

The present disclosure relates to the field of manufacturing display devices, in particular to an evaporation source and an evaporation device.

BACKGROUND

During the manufacture of an organic light-emitting diode (OLED) display device, the formation of a film by evaporation is a very important process.

An evaporation device for the evaporation process mainly includes a crucible and an evaporation source where the crucible is arranged. The film quality and the film characteristics directly depend on the two devices. For example, in the case that the crucible is not heated evenly, a portion of a material in the crucible may easily be heated to an oversized temperature, and the material may be deteriorated or an eruption may occur, thereby the film quality and the film characteristics may be adversely affected.

SUMMARY

An object of the present disclosure is to provide an evaporation source and an evaporation device, so as to heat the crucible evenly.

In one aspect, the present disclosure provides in some embodiments an evaporation source, including a heat source structure and an evaporation container for accommodating a to-be-evaporated material. The heat source structure includes a heat source and a thermal conductor. The thermal conductor is in contact with the evaporation container, and the heat source is at the thermal conductor and around the evaporation container. Heat from the heat source is transferred via the thermal conductor to the evaporation container, so as to heat the evaporation container.

Further, the thermal conductor includes a first accommodation space; the evaporation container is in the first accommodation space. The heat source is at a periphery of the first accommodation space and around the evaporation container.

Further, the heat source is in contact with an outer surface of the thermal conductor.

Further, the heat source is in the thermal conductor.

Further, the thermal conductor is of a hollow, cylindrical shape, and a hollow portion of the thermal conductor defines the first accommodation space.

Further, the thermal conductor includes a first portion which includes a plurality of parallel and spaced thermally conductive sheets. The thermally conductive sheets are evenly around a predetermined space, and the predetermined space defines the first accommodation space.

Further, the thermal conductor further includes a second portion which is of a hollow, cylindrical shape, and each thermally conductive sheet is on an inner wall of the second portion.

Further, the thermal conductor is of a cylindrical shape, and an inner surface of the thermal conductor is in contact with an entire outer surface of the evaporation container.

Further, the evaporation source further includes a cooling structure configured to cool the evaporation container during or after a heating process, the cooling structure is in contact with one of the heat source and the thermal conductor, and the heat source is at a position closer to the evaporation container than the cooling structure.

Further, the cooling structure includes a body and a plurality of circulation channels in the body, being in communication with each other and configured to circulate a cooling medium. The body is in contact with and around the heat source structure.

Further, the cooling structure includes a plurality of circulation channels in the thermal conductor, being in communication with each other and configured to circulate the cooling medium.

Further, the evaporation source further includes a thermal insulation layer covering an outer surface of one of the cooling structure and the thermal conductor.

Further, the thermal insulation layer includes a first thermal insulation layer and a second thermal insulation layer at a bottom surface of the first thermal insulation layer, the second thermal insulation layer and the first thermal insulation layer define a second accommodation space having an opening, and the cooling structure, the heat source and the thermal conductor are in the second accommodation space.

Further, the evaporation container is detachably arranged in the first accommodation space.

In another aspect, the present disclosure provides in some embodiments an evaporation device including the above-mentioned evaporation source.

In yet another aspect, the present disclosure provides in some embodiments an evaporation source, including a heat source structure and an evaporation container for accommodating a to-be-evaporated material. The heat source structure includes a heat source and a thermal conductor in contact with the evaporation container. The heat source is at the thermal conductor with a heat transfer path defined from the heat source to the evaporation container, and the heat transfer path passes through at least a portion of the thermal conductor.

Further, the thermal conductor is of a cylindrical structure, and an inner surface of the thermal conductor is in contact with an entire outer surface of the evaporation container.

Further, the thermal conductor is of a cylindrical structure, and a plurality of contacts is between an inner surface of the thermal conductor and an entire outer surface of the evaporation container and evenly on the outer surface of the evaporation container.

Further, the evaporation container is a crucible.

According to the embodiments of the present disclosure, through the thermal conductor between the heat source and the evaporation container, it is able to transfer the heat from the heat source to the evaporation container, thereby to heat the evaporation container evenly.

DETAILED DESCRIPTION OF THE EMBODIMENTS

In order to make the objects, the technical solutions and the advantages of the present disclosure more apparent, the present disclosure will be described hereinafter in conjunction with the drawings and embodiments.

Figure 1:
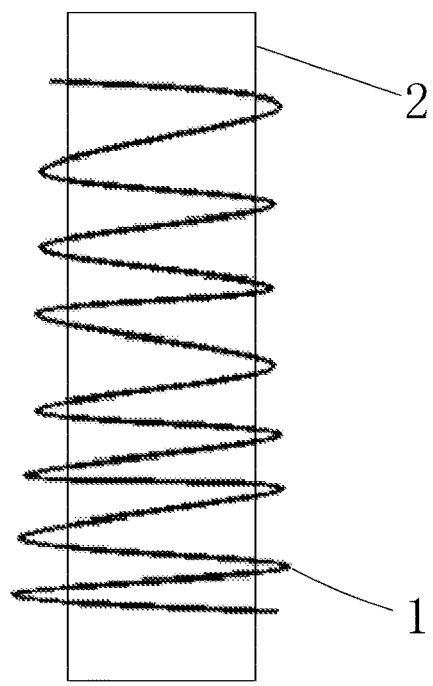
FIG. 1 is a schematic view showing an evaporation source in the related art.
Figure 2:
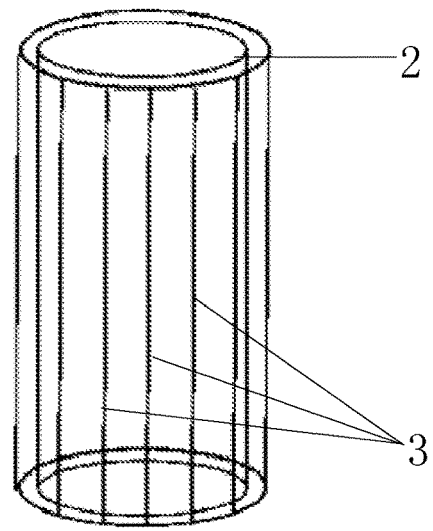
FIG. 2 is another schematic view showing the evaporation source in the related art.

As shown in FIG. 1, an evaporation source in the related art includes a crucible 2 and a spiral heating wire 1. The heating wire 1 surrounds the crucible 2. The entire crucible 2 may be heated through merely one heating wire. As shown in FIG. 2, another evaporation source in the related art includes the crucible 2 and a plurality of heating wires 3 arranged parallel to each other. The heating wires 3 are arranged uprightly around an outer periphery of the crucible 2, so as to heat the entire crucible 2.

For the above two evaporation sources, the heating wire(s) is arranged around an outer periphery of the crucible, so the entire crucible may not be heated evenly. To be specific, a temperature of a portion of the crucible close to the heating wire may increase rapidly, while a temperature of a portion of the crucible away from the heating wire may increase slowly. In the case that a heating process is not controlled in a better manner, a portion of a material in the crucible may easily be heated to an oversized temperature, and the material may be deteriorated or an eruption may occur.

The present disclosure provides in some embodiments an evaporation source, so as to heat the crucible evenly. The evaporation source includes a heat source structure and an evaporation container in which a to-be-evaporated material is arranged. The heat source structure includes a heat source and a thermal conductor. The thermal conductor is in contact with the evaporation container, and the heat source is arranged on the thermal conductor and around the evaporation container. Heat from the heat source is transferred via the thermal conductor to the evaporation container, so as to heat the evaporation container.

According to the embodiments of the present disclosure, through the thermal conductor between the heat source and the evaporation container, it is able to transfer the heat from the heat source to the evaporation container, thereby to heat the evaporation container evenly.

To be specific, the evaporation source may be applied to an evaporation device for an evaporation process, and the evaporation container is a crucible.

Optionally, the thermal conductor is arranged around an outer surface of the evaporation container, and contacts between the thermal conductor and the outer surface of the evaporation container are arranged evenly on the outer surface of the evaporation container. Alternatively, the entire outer surface of the evaporation container is in contact with the thermal conductor.

Optionally, the evaporation source further includes a cooling structure configured to cool the evaporation container during or after a heating process. The cooling structure and the heat source structure form together a combined structure. Through the cooling structure, it is able to cool the evaporation container during the heating process to a predetermined temperature, or control a cooling rate of the heated crucible. Optionally, the cooling structure is in direct contact with the heat source, so as to control the cooling rate, thereby to achieve an optimum cooling effect.

Optionally, the evaporation source further includes a thermal insulation layer in contact with, and arranged around, the combined structured of the cooling structure and the heat source structure. The thermal insulation layer is configured to thermally insulate the evaporation container from the outside during the heating process, so as to effectively prevent the heat dissipation or undesired heat loss.

The evaporation source applied to an evaporation device for an evaporation process will be described hereinafter in conjunction with FIGS. 3-6 by taking a crucible as the evaporation container as an example.

Figure 3:
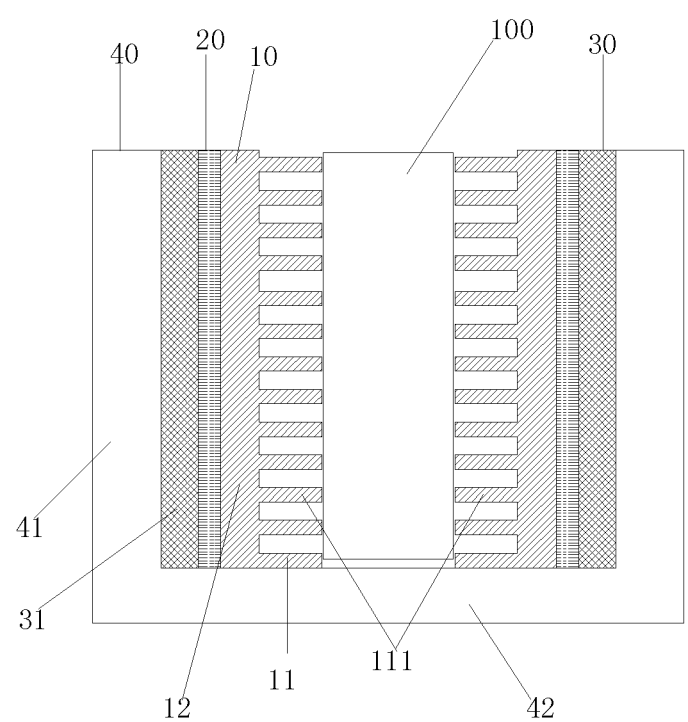
FIG. 3 is a schematic view showing an evaporation source according to one embodiment of the present disclosure.

As shown in FIG. 3, which is a schematic view showing the evaporation source according to one embodiment of the present disclosure. Referring to FIG. 3, the evaporation source includes a thermal conductor 10 and a heat source 20.

The thermal conductor 10 includes a first accommodation space in which a crucible (evaporation container) 100 is arranged. The heat source 20 is arranged at a periphery of the first accommodation space and around the crucible 100.

In the embodiments of the present disclosure, the heat source 20 is direct contact with an outer surface of the thermal conductor 10, and arranged around the entire crucible 100.

In the embodiments of the present disclosure, the thermal conductor 10 includes a first portion 11 and a second portion 12. The second portion 12 is of a hollow, cylindrical shape. The first portion 11 includes a plurality of thermally conductive sheets 111 arranged parallel to each other and at an interval. Each thermally conductive sheet 111 is arranged on, and in a direction perpendicular to, an inner wall of the second portion 12. The thermally conductive sheets 111 are arranged evenly around a predetermined space which forms the first accommodation space for holding the crucible 100.

As shown in FIG. 3, in the case that the crucible 100 is arranged within the first accommodation space formed by the first portion 11, each thermally conductive sheet 111 of the first portion 11 abuts against the crucible 110. Optionally, the thermally conductive sheets 11 are in contact with the crucible 100 at positions located evenly on the entire outer surface of the crucible 100. In this way, in the case that the heat source 20 is arranged around, and in contact with, an outer surface of the second portion 12, the heat from the heat source 20 may be evenly transferred to the crucible 100 due to the second portion 12 and the first portion 11 arranged evenly around the crucible 100, so as to heat the crucible evenly, thereby to prevent the occurrence of the problems in the related art where a portion of the crucible close to the heating wire may increase rapidly while a portion of the crucible away from the heating wire may increase slowly. As a result, it is able to prevent a portion of a material in the crucible from being heated to an oversized temperature in the case that a heating process is not controlled in a better manner, thereby to prevent the material from being deteriorated or prevent the occurrence of an eruption.

In addition, the heat source 20 may be of a heat wire structure. To be specific, one spiral heating wire, or a plurality of heating wires arranged parallel to each other, or a combination thereof, may be used.

As shown in FIG. 3, the evaporation source further includes a cooling structure 30 and a thermal insulation layer 40 arranged at a periphery of the cooling structure 30. Through the cooling structure 30, it is able to cool the heated crucible 100 to a predetermined temperature, or control a cooling rate of the heated crucible 100. Through the thermal insulation layer 40, it is able to thermally insulate the crucible 100 from the outside, thereby to prevent the heat dissipation or undesired heat loss.

The cooling structure 30 may use a gaseous or liquid cooling medium. To be specific, as shown in FIG. 3, the cooling structure 30 includes a body 31 and a plurality of first circulation channels arranged in the body 31. The first circulation channels are in communication with each other and configured to circulate the cooling medium. In the embodiment of the present disclosure, the body 31 is in contact with the heat source structure 20, and the first circulation channels are arranged evenly around the heat source 20, so as to cool the entire heat source 20 evenly.

The thermal insulation layer 40 is arranged at a periphery of, and in contact with, the body 31 of the cooling structure 30. The thermal insulation layer 40 further includes a first thermal insulation layer 41 and a second thermal insulation layer 42. The first thermal insulation layer 41 surrounds the body 31. The first thermal insulation layer 41 is of a hollow, cylindrical structure with openings at its upper and lower ends. The second thermal insulation layer 42 is arranged at a bottom surface of the first thermal insulation layer 41 and configured to seal the bottom surface of the cylindrical first thermal insulation layer 41. The second thermal insulation layer 42 and the first thermal insulation layer 41 are combined to define a second accommodation space having an opening. The combined structure of the cooling structure and the heat structure is accommodated in the second accommodation space.

Figure 4:
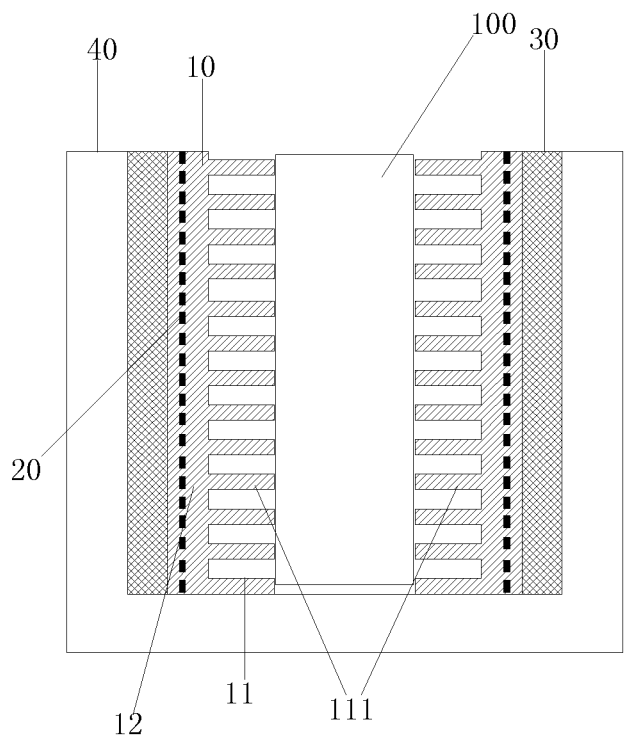
FIG. 4 is another schematic view showing the evaporation source according to one embodiment of the present disclosure.

As shown in FIG. 4, which is another schematic view showing the evaporation source according to one embodiment of the present disclosure. Referring to FIG. 4, the evaporation source is similar to that that in FIG. 3, and includes a thermal conductor 10 and a heat source 20. The thermal conductor 10 includes a first accommodation space in which the crucible 100 is arranged, and the heat source 20 is arranged around the crucible 100 and at a periphery of the first accommodation space.

In FIG. 4, the heat source 20 is embedded into the thermal conductor 10. In this way, it is able to heat the thermal conductor 10 in a convenient manner and transfer the heat to the thermal conductor 10 effectively, thereby to transfer more heat to the crucible 100 via the thermal conductor 10.

Similar to FIG. 3, the thermal conductor 10 in FIG. 4 also includes a first portion 11 and a second portion 12. The second portion 12 is of a hollow, cylindrical shape. The first portion 11 includes a plurality of thermally conductive sheets 111 arranged parallel to each other and at an interval. Each thermally conductive sheet 111 is arranged on, and in a direction perpendicular to, an inner wall of the second portion 12. The thermally conductive sheets 111 are arranged evenly around a predetermined space which forms the first accommodation space for holding the crucible 100.

As shown in FIG. 4, in the case that the crucible 100 is arranged within the first accommodation space formed by the first portion 11, each thermally conductive sheet 111 of the first portion 11 abuts against the crucible 110. Optionally, the thermally conductive sheets 11 are in contact with the crucible 100 at positions located evenly on the entire outer surface of the crucible 100. In this way, in the case that the heat source 20 is arranged around, and in contact with, an outer surface of the second portion 12, the heat from the heat source 20 may be evenly transferred to the crucible 100 due to the second portion 12 and the first portion 11 arranged evenly around the crucible 100, so as to heat the crucible evenly, thereby to prevent the occurrence of the problems in the related art where a portion of the crucible close to the heating wire may increase rapidly while a portion of the crucible away from the heating wire may increase slowly. As a result, it is able to prevent a portion of a material in the crucible from being heated to an oversized temperature in the case that a heating process is not controlled in a better manner, thereby to prevent the material from being deteriorated or prevent the occurrence of an eruption.

As shown in FIG. 4, on the basis of the above-mentioned structure of the thermal conductor 10, the heat source 20 is arranged inside the second portion 12, and optionally, arranged evenly around the crucible 100. Of course, the heat source 20 may also extend into each thermally conductive sheet 111 of the first portion 11. To be specific, the heat source 20 may be of a heating wire structure. To be specific, one spiral heating wire, or a plurality of heating wires arranged parallel to each other, or a combination thereof, may be used.

In the embodiment of the present disclosure, apart from being embedded into the thermal conductor 10 as shown in FIG. 4, the heat source 20 may also be of a structure obtained by combining FIG. 3 and FIG. 4, i.e., a portion of the heat source 20 may be embedded into the thermal conductor 10 and the other portion of the heat source may be around the outer surface of the thermal conductor 10. These two portions may be controlled separately or uniformly.

In addition, the evaporation source in FIG. 4 may further include a cooling structure 30 and a thermal insulation layer 40. The cooling structure 30 and the thermal insulation layer 40 have structures similar or identical to those in FIG. 3, and thus will not be particularly defined herein.

Figure 5:
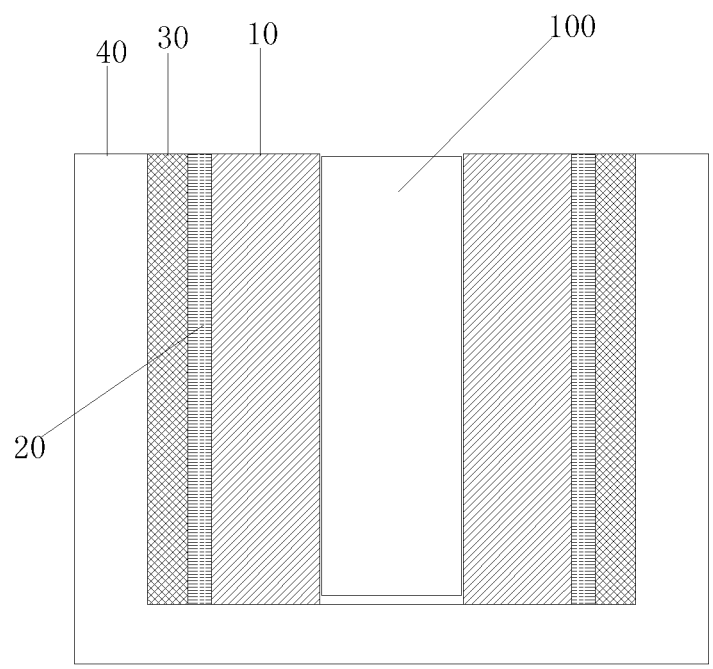
FIG. 5 is yet another schematic view showing the evaporation source according to one embodiment of the present disclosure.

As shown in FIG. 5, which is yet another schematic view showing the evaporation source according to one embodiment of the present disclosure. Referring to FIG. 5, the evaporation source is similar to that in FIG. 3, and includes a thermal conductor 10 and a heat source 20. The thermal conductor 10 includes a first accommodation space in which the crucible 100 is arranged, and the heat source 20 is arranged around the crucible 100 and at a periphery of the first accommodation space.

In FIG. 5, the thermal conductor 10 is of a hollow, cylindrical shape, and a hollow portion thereof forms the first accommodation space in which the crucible 100 is arranged. In the case that the crucible 100 is arranged in the first accommodation space, an entire surface of an inner wall of the thermal conductor 10 is in contact with an outer surface of the crucible 100. Different from FIG. 3 where the thermally conductive sheets 111 of the thermal conductor 10 are in contact with the crucible 100 at an interval, a contact surface between the thermal conductor 10 in FIG. 5 and the crucible 100 is larger, so it is able to transfer the heat from the heat source 20 to the crucible 100 in time and effectively.

In FIG. 5, the heat source 20 is in direct contact with the outer surface of the thermal conductor 10, and arranged around the entire crucible 100. To be specific, the heat source 20 may be of a heating wire structure, and one spiral heating wire, or a plurality of heating wires arranged parallel to each other, or a combination thereof, may be used.

Of course, in the case that the thermal conductor 10 has the structure in FIG. 5, apart from being arranged around the thermal conductor 10, the heat source 20 may also be embedded into the thermal conductor 10, or be of a combined structure where a portion of the heat source 20 may be embedded into the thermal conductor 10 and the other portion of the heat source may be around the outer surface of the thermal conductor 10.

In addition, as shown in FIG. 5, the evaporation source, similar to those in FIGS. 3 and 4, may further include a cooling structure 30 and a thermal insulation layer 40. The cooling structure 30 and the thermal insulation layer 40 may have structures identical to those mentioned above, and thus will not be particularly defined herein.

Figure 6:
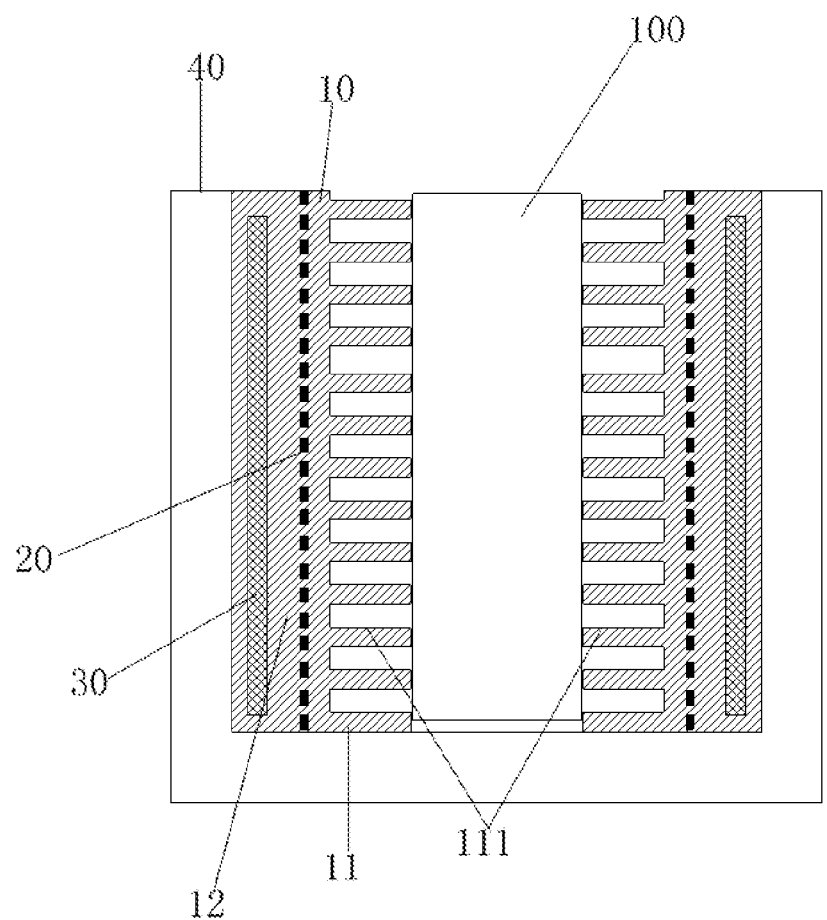
FIG. 6 is still yet another schematic view showing the evaporation source according to one embodiment of the present disclosure.

As shown in FIG. 6, which is still yet another schematic view showing the evaporation source according to one embodiment of the present disclosure. Referring to FIG. 6, the evaporation source includes a thermal conductor 10, a heat source 20, a cooling structure 30 and a thermal insulation layer 40. The cooling structure 30, the thermal conductor 10 and the heat source 20 are formed integrally to form a combined structure, and the thermal insulation layer 40 is arranged around the combined structure.

To be specific, as shown in FIG. 6, the thermal conductor 10 has a structure identical to that in FIG. 3, i.e., it includes a first portion 11 and a second portion 12. The first portion 11 includes a plurality of thermally conductive sheets 111 arranged parallel to each other and at an interval. Each thermally conductive sheet 111 is arranged on, and in a direction perpendicular to, an inner wall of the second portion 12. The thermally conductive sheets 111 are arranged evenly around a predetermined space which forms the first accommodation space for holding the crucible 100.

The heat source 20 and the cooling structure 30 are embedded into the second portion 12 and arranged around the first accommodation space. Of course, in the case that the thermally conductive sheet 111 has a sufficient thickness, the heat source 20 and the cooling structure 30 may also extent into the thermally conductive sheet 11. In this way, it is able to effectively transfer the heat from the heat source 20 to the crucible 100 via the thermal conductor 10, and effectively cool the crucible 100 during or after a heating process.

On the basis of the combined structure of the cooling structure 30, the thermal conductor 10 and the heat source 20, the thermal insulation layer 40 is arranged around, and abuts against, an outer surface of the thermal conductor 10, so as to thermally insulate the crucible from the outside.

In FIG. 6, the heat source 20, the cooling structure 30 and the thermal insulation layer 40 have structures identical to those in FIG. 3, and thus will not be particularly defined herein.

In addition, in the combined structure of the cooling structure 30, the thermal conductor 10 and the heat source 20, the thermal conductor 10 is not limited to the structure in FIG. 6, and it may also be of the structure in FIG. 5.

The evaporation source in the embodiments of the present disclosure may be applied to a film manufacturing process for a display device, so as to evenly heat the crucible and prevent the heat dissipation and undesired heat loss. As a result, it is able to prevent the occurrence of the problems in the related art where a portion of a material in the crucible may easily be heated to an oversized temperature and the material may be deteriorated or an eruption may occur, thereby to ensure the film quality.

The present disclosure further provides in some embodiments an evaporation device including the above-mentioned evaporation source. The other components of the evaporation device are known in the art, and thus will not be particularly defined herein.

The above are merely the optional embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An evaporation source, comprising: a heat source structure and an evaporation container for accommodating a to-be-evaporated material;
    wherein the heat source structure comprises a heat source and a thermal conductor, and the thermal conductor is in contact with the evaporation container, and the heat source is at the thermal conductor and around the evaporation container;
    wherein the thermal conductor comprises a first portion and a second portion; the second portion is of a hollow, cylindrical shape, and a hollow portion of the second portion defines a first accommodation space; and
    wherein the evaporation container is in the first accommodation space; the first portion is in the first accommodation space and includes a plurality of spaced thermally conductive sheets; each thermally conductive sheet is on an inner wall of the second portion and is perpendicular to the inner wall of the second portion; and each thermally conductive sheet abuts against the evaporation container;
    wherein the evaporation source further includes a cooling structure configured to cool the evaporation container during or after a heating process; the cooling structure is disposed in the thermally conductive sheets.

2. The evaporation source according to claim 1, wherein the heat source is at a periphery of the first accommodation space and around the evaporation container.

3. The evaporation source according to claim 2, wherein the heat source is in contact with an outer surface of the thermal conductor.

4. The evaporation source according to claim 2, wherein the heat source is in the thermal conductor.

5. The evaporation source according to claim 1,
    wherein the cooling structure is in contact with the heat source, and the heat source is at a position closer to the evaporation container than the cooling structure.

6. The evaporation source according to claim 5, wherein the cooling structure comprises a body and a plurality of circulation channels in the body; the circulation channels are in communication with each other and configured to circulate a cooling medium; the body is in contact with and around the heat source structure.

7. The evaporation source according to claim 5, wherein the cooling structure comprises a plurality of circulation channels in the thermal conductor; the circulation channels are in communication with each other and configured to circulate a cooling medium.

8. The evaporation source according to claim 5, further comprising a thermal insulation layer; wherein the thermal insulation layer covers an outer surface of one of the cooling structure and the thermal conductor.

9. The evaporation source according to claim 8, wherein the thermal insulation layer comprises a first thermal insulation layer and a second thermal insulation layer at a bottom surface of the first thermal insulation layer; the second thermal insulation layer and the first thermal insulation layer define a second accommodation space having an opening; the cooling structure, the heat source and the thermal conductor are in the second accommodation space.

10. The evaporation source according to claim 1, wherein each thermally conductive sheet extends from the inner wall of the second portion to the evaporation container in a radial direction of the second portion.

11. The evaporation source according to claim 10, wherein the thermally conductive sheets are spaced from each other in an axial direction of the second portion.

12. The evaporation source according to claim 1, wherein the cooling structure is embedded into the second portion and the thermally conductive sheets.

13. The evaporation source according to claim 12, wherein the heat source is embedded into the second portion and the thermally conductive sheets.

14. An evaporation device comprising the evaporation source according to claim 1.

15. An evaporation source, comprising: a heat source structure and an evaporation container for accommodating a to-be-evaporated material;
wherein the heat source structure comprises a heat source and a thermal conductor in contact with the evaporation container; the heat source is at the thermal conductor with a heat transfer path defined from the heat source to the evaporation container, and the heat transfer path passes through at least a portion of the thermal conductor;
wherein the thermal conductor comprises a first portion and a second portion; the second portion is of a hollow, cylindrical shape, and a hollow portion of the second portion defines a first accommodation space; the evaporation container is in the first accommodation space; and
wherein the first portion is in the first accommodation space and includes a plurality of spaced thermally conductive sheets; each thermally conductive sheet is on an inner wall of the second portion and is perpendicular to the inner wall of the second portion; and each thermally conductive sheet abuts against the evaporation container;
wherein the evaporation source further includes a cooling structure configured to cool the evaporation container during or after a heating process; the cooling structure is disposed in the thermally conductive sheets.

16. The evaporation source according to claim 15, wherein the evaporation container is detachably arranged in the thermal conductor.

17. The evaporation source according to claim 15, wherein each thermally conductive sheet extends from the inner wall of the second portion to the evaporation container in a radial direction of the second portion.

18. The evaporation source according to claim 17, wherein the thermally conductive sheets are spaced from each other in an axial direction of the second portion.

19. The evaporation source according to claim 15, wherein the cooling structure is embedded into the second portion and the thermally conductive sheets.

20. The evaporation source according to claim 19, wherein the heat source is embedded into the second portion and the thermally conductive sheets.

* * * * *